(12) United States Patent
Peng et al.

(10) Patent No.: US 11,096,305 B1
(45) Date of Patent: Aug. 17, 2021

(54) SERVER

(71) Applicants: Inventec (Pudong) Technology Corporation, Shanghai (CN); INVENTEC CORPORATION, Taipei (TW)

(72) Inventors: Ping-Wei Peng, Taipei (TW); Wen-Long Huang, Shanghai (CN); Xing Liu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/901,327

(22) Filed: Jun. 15, 2020

(30) Foreign Application Priority Data

Mar. 19, 2020 (CN) .......................... 202010197037.3

(51) Int. Cl.
  *H05K 7/14* (2006.01)
  *H05K 5/03* (2006.01)

(52) U.S. Cl.
  CPC ............. *H05K 7/1487* (2013.01); *H05K 5/03* (2013.01); *H05K 7/1418* (2013.01); *H05K 7/1489* (2013.01)

(58) Field of Classification Search
  None
  See application file for complete search history.

(56) References Cited

U.S. PATENT DOCUMENTS

| | | | | |
|---|---|---|---|---|
| 6,392,884 B1 * | 5/2002 | Chou | ...................... | G06F 1/184 360/98.01 |
| 6,611,424 B2 * | 8/2003 | Huang | ................. | G11B 33/128 248/224.51 |
| 6,826,055 B2 * | 11/2004 | Mease | ..................... | G06F 1/184 312/223.1 |
| 8,054,620 B2 * | 11/2011 | Roesner | ............... | G11B 33/128 361/679.33 |
| 9,265,173 B1 * | 2/2016 | Jhang | ..................... | G06F 1/187 |
| 9,491,884 B2 * | 11/2016 | Chung | ................. | H05K 7/1487 |
| 9,717,158 B2 * | 7/2017 | Della Fiora | .......... | H05K 7/1487 |
| 9,781,857 B2 * | 10/2017 | Jau | ....................... | H05K 7/1487 |
| 9,854,698 B2 * | 12/2017 | Della Fiora | ............. | G06F 1/189 |
| 10,104,803 B1 * | 10/2018 | Lin | .......................... | H05K 7/18 |
| 10,362,706 B2 * | 7/2019 | Sun | ......................... | F16C 11/04 |
| 10,383,247 B2 * | 8/2019 | Chen | .................... | H05K 7/1487 |

(Continued)

*Primary Examiner* — Xanthia C Cunningham
(74) *Attorney, Agent, or Firm* — Locke Lord LLP; Tim Tingkang Xia, Esq.

(57) ABSTRACT

A server configured to accommodate a storage device includes a chassis, an electronic component, a first positioning pin, a second positioning pin, and a slide rail. The chassis includes a first bottom plate, a first side plate, a first side wall, a first partition and a second partition that are disposed on the first bottom plate. The first bottom plate is divided into a first area, a second area and a third area. The third area is configured for the storage device to be placed thereon. The electronic component is disposed in the first area and configured to be electrically connected to the storage device. The first positioning pin is disposed on the first side wall. The second positioning pin is disposed in the third area. The slide rail has a first positioning groove and is detachably disposed on the first positioning pin via the first positioning groove.

10 Claims, 7 Drawing Sheets

(56) References Cited

U.S. PATENT DOCUMENTS

| | | | | |
|---|---|---|---|---|
| 10,834,842 B1* | 11/2020 | Elsasser | ............... | H05K 7/1489 |
| 2003/0102785 A1* | 6/2003 | Tsai | ..................... | G11B 33/128 |
| | | | | 312/223.1 |
| 2008/0037209 A1* | 2/2008 | Niazi | ..................... | G06F 1/181 |
| | | | | 361/727 |
| 2008/0217497 A1* | 9/2008 | Yang | .................... | H05K 7/1489 |
| | | | | 248/298.1 |
| 2013/0342990 A1* | 12/2013 | Jau | ....................... | H05K 7/1487 |
| | | | | 361/679.39 |
| 2014/0293523 A1* | 10/2014 | Jau | ....................... | H05K 7/1487 |
| | | | | 361/679.4 |
| 2014/0362515 A1* | 12/2014 | Pronozuk | ............. | H05K 7/1487 |
| | | | | 361/679.31 |
| 2015/0136722 A1* | 5/2015 | Chen | .................... | H05K 7/1489 |
| | | | | 211/175 |
| 2016/0135322 A1* | 5/2016 | Chen | .................... | G11B 33/128 |
| | | | | 361/679.46 |
| 2019/0325917 A1* | 10/2019 | Chang | ................. | G11B 33/124 |

* cited by examiner

SERVER

CROSS-REFERENCE TO RELATED APPLICATIONS

This non-provisional application claims priority under 35 U.S.C. § 119(a) on Patent Application No(s). 202010197037.3 filed in China, P.R.C. on Mar. 19, 2020, the entire contents of which are hereby incorporated by reference.

BACKGROUND OF THE INVENTION

Technical Field of the Invention

The present disclosure relates to a server, more particularly to a server using at least one positioning pin to flexibly utilizing an accommodating space thereof.

Description of the Related Art

As technology develops, cloud services are widely used in various industries. Some would require a relatively large quantity of hard disk drives to store massive database, while some other would require a relatively small quantity of hard disk drives to save cost.

The servers for accommodating different quantities of hard disk drives may have different structures and sizes. It may increase the cost in manufacturing and managing the servers that can accommodate different quantities of hard disk drives. Therefore, how to manufacture a server that can accommodate different quantities of hard disk drives by using the same components as much as possible becomes a problem to be solved.

SUMMARY OF THE INVENTION

The present disclosure provides a server, which is capable of accommodating different quantities of hard disk drives by changing the structure and size thereof on the premise of using the same components as much as possible.

According to one aspect of the present disclosure, a server configured to accommodate at least one storage device includes a chassis, an electronic component, at least one first positioning pin, at least one second positioning pin, and at least one slide rail. The chassis includes a first bottom plate, at least one first side wall, a first partition and a second partition. The at least one first side wall, the first partition, and the second partition are disposed on the first bottom plate. The first partition and the second partition are located at the same side of the at least one first side wall. The first bottom plate is divided into a first area, a second area, and a third area by the first partition and the second partition. The second area is located between the first area and the third area. The third area is configured for the at least one storage device to be placed therein. The electronic component is disposed in the first area of the first bottom plate. The electronic component is configured to be electrically connected to the at least one storage device. The first partition is located closer to the electronic component than the second partition. The at least one first positioning pin is disposed at a side of the at least one first side wall located away from the first partition and the second partition. The at least one second positioning pin is disposed in the third area of the first bottom plate. The at least one slide rail has at least one first positioning groove. The at least one slide rail is detachably disposed on the at least one first positioning pin via the at least one first positioning groove.

According to the server discussed above, the second positioning pins are configured for different components to be disposed thereon based on the actual requirement. The second positioning pins allows different components that can accommodate or support the at least one storage device, thus the arrangement of the server can be flexibly changed according to the actual requirement. And, in this way, the arrangements of the server in the first area and the second area will not be affected by the arrangement of the server in the third area, thus components in the first area and the second area can be still utilized as the arrangement of the server in the third area is changed.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
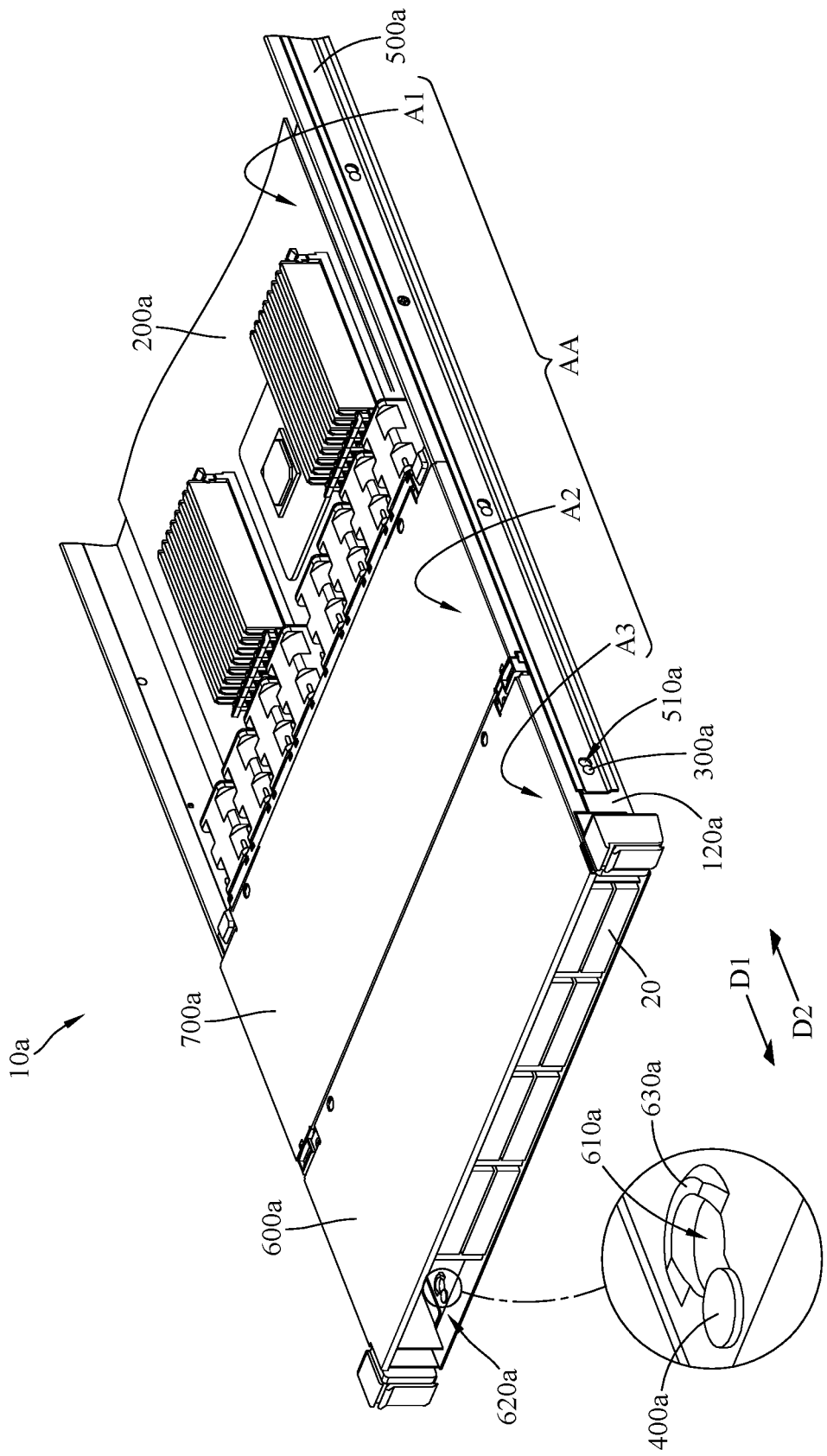
FIG. 1 is a perspective view of a server according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
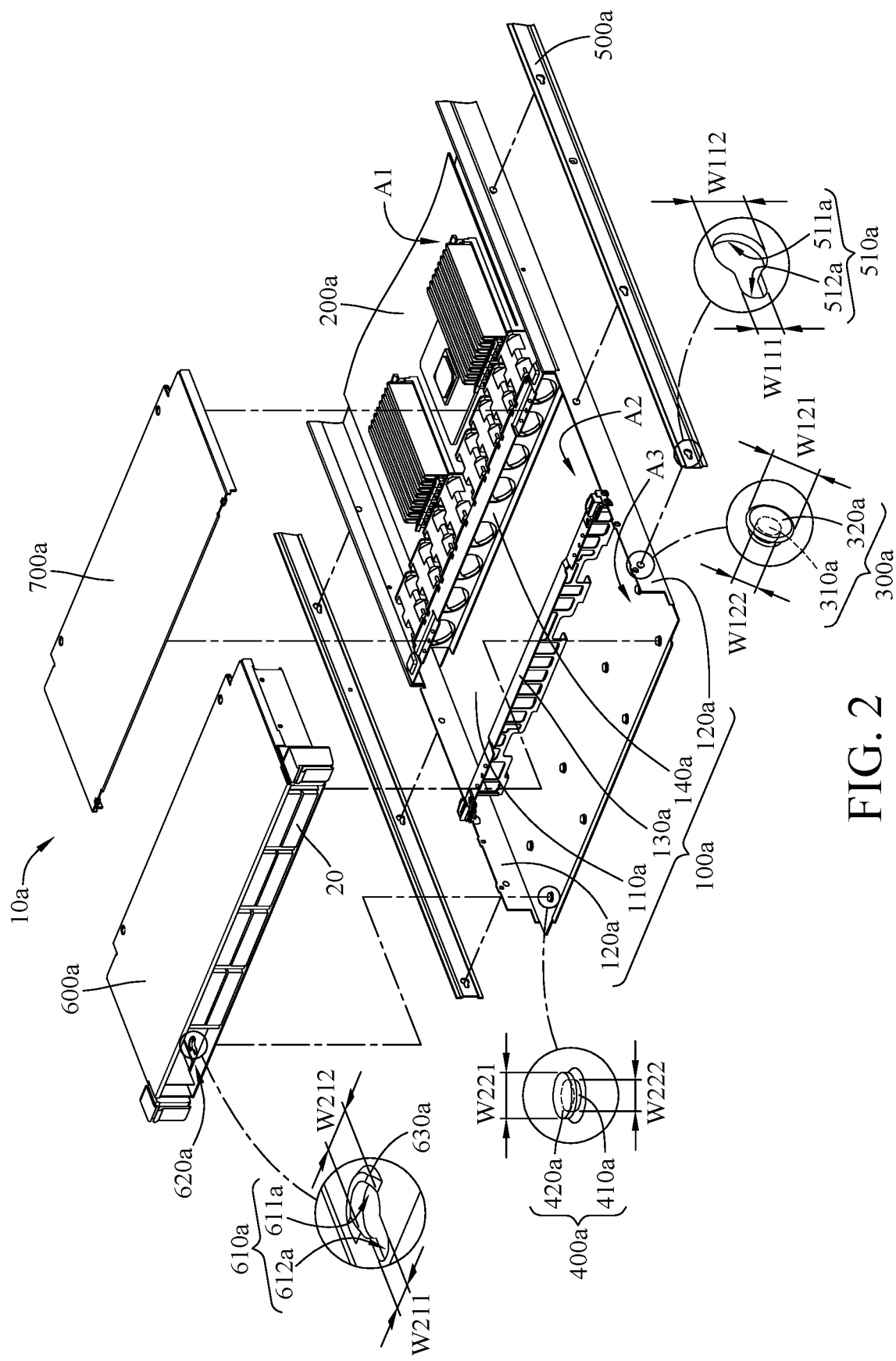
FIG. 2 is an exploded view of the server in FIG. 1.

Please refer to FIG. 1 to FIG. 2, where FIG. 1 is a perspective view of a server 10a according to one embodiment of the present disclosure, and FIG. 2 is an exploded view of the server 10a in FIG. 1. This embodiment provides the server 10a configured to accommodate at least one storage device 20. Specifically, the storage device 20 is, for example, a hard disk drive or an optical disk drive, where the hard disk drive may be 2.5-inch or 3.5-inch. The server 10a includes a chassis 100a, an electronic component 200a, at least one first positioning pin 300a, at least one second positioning pin 400a, and at least one slide rail 500a.

The chassis 100a includes a first bottom plate 110a, at least one first side wall 120a, a first partition 130a, and a second partition 140a. The quantity of the first side wall 120a is, for example, two. The first side walls 120a, the first partition 130a, and the second partition 140a are disposed on the first bottom plate 110a. The first partition 130a and the second partition 140a are located at the same side of one of the first side walls 120a. Specifically, in this and some embodiments of the present disclosure, the first partition 130a and the second partition 140a are located between the two first side walls 120a. In this embodiment, the first bottom plate 110a and the first side walls 120a together form an accommodation space AA, and the accommodation space AA is divided into a first area A1, a second area A2, and a third area A3 by the first partition 130a and the second partition 140a. The second area A2 is located between the first area A1 and the third area A3. The third area A3 is configured for the at least one storage device 20 to be placed therein.

The electronic component 200a is, for example, an assembly of a motherboard and a central processing unit. The electronic component 200a is disposed in the first area A1 of the chassis 100a. The electronic component 200a is configured to be electrically connected to the at least one storage device 20 for reading or writing data thereof. The first partition 130a is located closer to the electronic component 200a than the second partition 140a. The quantity of the first positioning pin 300a is, for example, plural. The first positioning pins 300a are disposed on sides of the first side walls 120a located away from the first partition 130a and the second partition 140a.

The quantity of the slide rail 500a is, for example, two. Each of the slide rails 500a has at least one first positioning groove 510a. Specifically, the quantity of the first positioning groove 510a is, for example, plural. The quantity of the first positioning grooves 510a may be equal to the quantity of the first positioning pins 300a, and the quantity of the slide rails 500a may be equal to the quantity of the first side walls 120a. The slide rails 500a are detachably disposed on the first positioning pins 300a via the first positioning grooves 510a, and thus the slide rails 500a are located at the sides of the first side walls 120a located away from the first partition 130a and the second partition 140a. In addition, the server 10a can be installed in a server cabinet (not shown) via the slide rails 500a so as to be easily arranged and managed.

The quantity of the second positioning pin 400 is, for example, plural. The second positioning pins 400a are disposed in the third area A3 of the chassis 100a. Note that the at least one storage device 20 is not directly disposed on the second positioning pins 400a. The second positioning pins 400a are configured for different components to be disposed thereon based on the actual requirement. For example, the second positioning pins 400a can be configured for a hard or optical disk drive carrier to be directly disposed thereon, and thus the at least one storage device 20 can be disposed in the hard or optical disk drive carrier. Alternatively, the second positioning pins 400a can be configured for a frame to be directly disposed thereon, the frame can be configured for a hard or optical disk drive carrier to be directly disposed thereon, and thus the at least one storage device 20 can be disposed in the hard or optical hard disk carrier on the frame. Therefore, the second positioning pins 400a allows different components (e.g., the carrier or the frame) that can accommodate or support the at least one storage device 20, thus the arrangement of the server 10a can be flexibly changed according to the actual requirement. And, in this way, the arrangements of the server 10a in the first area A1 and the second area A2 will not be affected by the arrangement of the server 10a in the third area A3, thus components in the first area A1 and the second area A2 can be still utilized as the arrangement of the server 10a in the third area A3 is changed.

In specific, taking the carrier for instance, in this and some embodiments of the present disclosure, the server 10a may further includes a first carrier 600a. The first carrier 600a has at least one second positioning groove 610a and a first opening 620a. The quantity of the second positioning groove 610a is, for example, plural. The quantity of the second positioning grooves 610a may be equal to the quantity of the second positioning pins 400a. The longitudinal directions of the second positioning grooves 610a are in the same direction (e.g., a direction D1 shown in FIG. 1) where the first opening 620a faces. The first carrier 600a is detachably disposed on the second positioning pins 400a in the third area A3 via the second positioning grooves 610a. The first opening 620a of the first carrier 600a allows the at least one storage device 20 to be accommodated in or removed from the first carrier 600a. Note that the quantity of the at least one storage device 20 may be changed based on the actual requirement. For example, the first carrier 600a can accommodates at most eight 2.5-inch hard disk drives or at most four 3.5-inch hard disk drives. And, there is still space in the first carrier 600a after the eight 2.5-inch hard disk drives or four 3.5-inch hard disk drives are accommodated therein, and thus an optical disk drive (not shown) may be accommodated in the first carrier 600a. Since the storage device 20 are accommodated in the first carrier 600a, it is easy to arrange or move the storage devices 20.

In this and some embodiments of the present disclosure, since the second positioning grooves 610a have the same structure, and the second positioning pins 400a have the same structure, thus only one second positioning groove 610a and one second positioning pin 400a would be introduced hereinafter. The second positioning groove 610a has a wide portion 611a and a narrow portion 612a connected to each other. The narrow portion 612a is located closer to the first opening 620a than the wide portion 611a. A width W211 of the narrow portion 612a is less than a width W212 of the wide portion 611a. The second positioning pin 400a has a neck portion 410a and a head portion 420a. The head portion 420a is connected to one end of the neck portion 410a located away from the first bottom plate 110a. A width W221 of the head portion 420a ranges between the width W212 of the wide portion 611a and the width W211 of the narrow portion 612a. A width W222 of the neck portion 410a is less than the width W212 of the wide portion 611a and the width W211 of the narrow portion 612a. During the installation of the first carrier 600a on the second positioning pins 400a, the wide portions 611a of the second positioning grooves 610a are respectively aligned with the second positioning pins 400a, then the head portions 420a of the second positioning pins 400a respectively pass through the wide portions 611a of the second positioning grooves 610a, and then the first carrier 600a is moved along a direction D2 opposite to the direction D1, such that the first carrier 600a is engaged with the second positioning pins 400a, thereby accomplishing the installation of the first carrier 600a.

Similarly, since the first positioning grooves 510a have the same structure, and the first positioning pins 300a have the same structure, thus only one first positioning groove 510a and one first positioning pin 300a would be introduced hereinafter. The first positioning groove 510a has a wide portion 511a and a narrow portion 512a connected to each other. The narrow portion 512a is located closer to the first opening 620a than the wide portion 511a. A width W111 of the narrow portion 512a is less than a width W112 of the wide portion 511a. The first positioning pin 300a has a neck portion 310a and a head portion 320a. The head portion 320a is connected to one end of the neck portion 310a located away from the first side wall 120a. A width W121 of the head portion 320a ranges between the width W112 of the wide portion 511a and the width W111 of the narrow portion 512a. A width W122 of the neck portion 310a is less than the width W112 of the wide portion 511a and the width W111 of the narrow portion 512a. During the installation of the slide rails 500a on the first positioning pins 300a, the wide portions 511a of the first positioning grooves 510a are respectively aligned with the first positioning pins 300a, then the head portions 320a of the first positioning pins 300a respectively pass through the wide portions 511a of the first positioning grooves 510a, and then the slide rails 500a is moved along the direction D2, such that the slide rails 500a is engaged with the first positioning pins 300a, thereby accomplishing the installation of the slide rails 500a.

After installing the first carrier 600a and the slide rails 500a, the first side walls 120a can be fixed to the first carrier 600a and the slide rails 500a by screwing so as to secure the entire structure of the server 10a. To remove the first carrier 600a and the slide rails 500a, the aforementioned steps of the installation of the first carrier 600a and the slide rails 500a can be reversely performed.

In this and some embodiments of the present disclosure, the first carrier 600a may further include at least one first protrusion portion 630a. The quantity of the at least one first protrusion portion 630a may be equal to the quantity of the second positioning grooves 610a. The first protrusion portions 630a are respectively located adjacent to the wide portions 611a of the second positioning grooves 610a. The first protrusion portions 630a can enhance the structural strength of the first carrier 600a so as to prevent structural damage near the wide portions 611a due to an unexpected impact during the installation of the first carrier 600a.

In this and some embodiments of the present disclosure, the server 10a may further include a cover plate 700a disposed on the first partition 130a or the second partition 140a. The cover plate 700a is opposite to and spaced apart from the first bottom plate 110a. The cover plate 700a is located in the second area A2. When the server 10a only requires to equip with at most eight 2.5-inch hard disk drives or at most four 3.5-inch hard disk drives, all of them can be accommodated in the first carrier 600a located in the third area A3, and the second area A2 can be covered by the cover plate 700a so as to prevent unnecessary substances such as dust from entering the server 10a.

Figure 3:
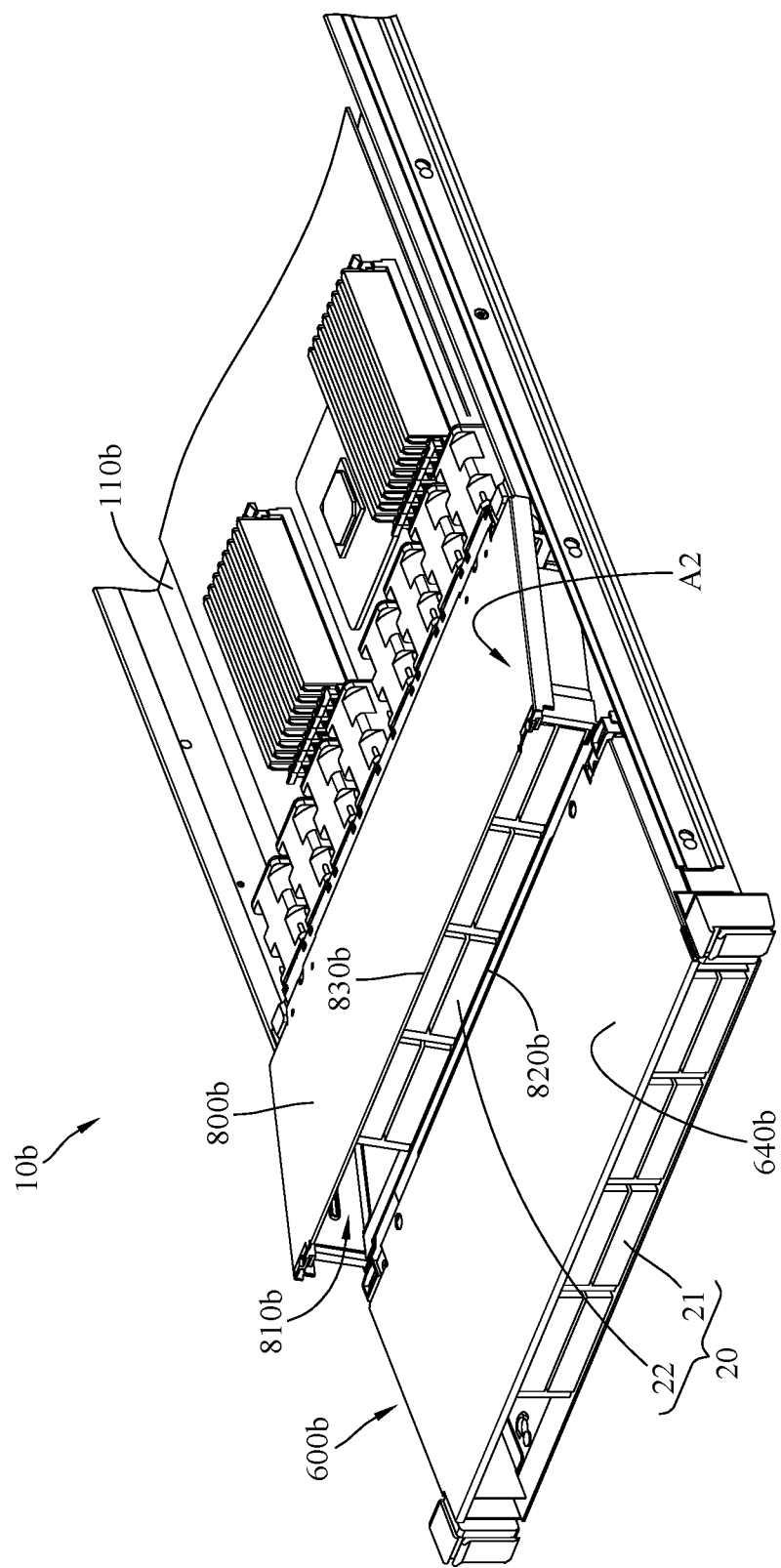
FIG. 3 is a perspective view of a server according to another embodiment of the present disclosure.

The configuration of the server 10a accommodating at most eight 2.5-inch hard disk drives or at most four 3.5-inch hard disk drives is provided above. The configuration of accommodating at most sixteen 2.5-inch hard disk drives or at most eight 3.5-inch hard disk drives will be provided hereinafter. Please refer to FIG. 3, which is a perspective view of a server 10b according to another embodiment of the present disclosure. Only the differences between this and the previous embodiments are illustrated hereinafter. In this and some embodiments of the present disclosure, the quantity of the at least one storage device 20 is plural. The storage devices 20 are divided into two groups: a first storage device group 21 and a second storage device group 22. The server 10b may further include a second carrier 800b. The second carrier 800b is pivotably disposed on the first bottom plate 110b and is located in the second area A2. There is no cover plate disposed in the second area A2, which is different from the previous embodiment.

The second carrier 800b has a second opening 810b located adjacent to the first carrier 600b. The second carrier 800b has a first edge 820b and a second edge 830b that are opposite to each other at the second opening 810b. The first edge 820b is located between the first bottom plate 110b and the second edge 830b. The first carrier 600b has a top surface 640b facing away from the first bottom plate 110b. The first edge 820b is located at a side of the top surface 640b located away from the first bottom plate 110b or is located between the top surface 640b and the first bottom plate 110b based on a pivoting position of the second carrier 800b with respect to the first bottom plate 110b. In other words, the second opening 810b is selectively exposed outside based on the pivoting of the second carrier 800b with respect to the first bottom plate 110b. When the second opening 810b is exposed outside, the second opening 810b of the second carrier 800b allows the second storage device group 22 to be accommodated in or removed from the second carrier 800b. In addition, the first storage device group 21 is accommodated in or removed from the first carrier 600b in a manner abovementioned. In detail, in the case of the storage devices 20 including 2.5-inch hard disk drives, each of the first carrier 600b and the second carrier 800b can accommodate at most eight storage devices 20; in the case of the storage devices 20 including 3.5-inch hard disk drives, each of the first carrier 600b and the second carrier 800b can accommodate at most four storage devices 20. In addition, the storage devices 20 may further include an optical disk drive based on the actual requirement. There is still space in the first carrier 600b or the second carrier 800b to accommodate the optical disk drive after the eight 2.5-inch hard disk drives or four 3.5-inch hard disk drives are accommodated therein. Since the storage devices 20 are accommodated in the first carrier 600b and the second carrier 800b, it is easy to arrange or move the storage devices 20.

Figure 4:
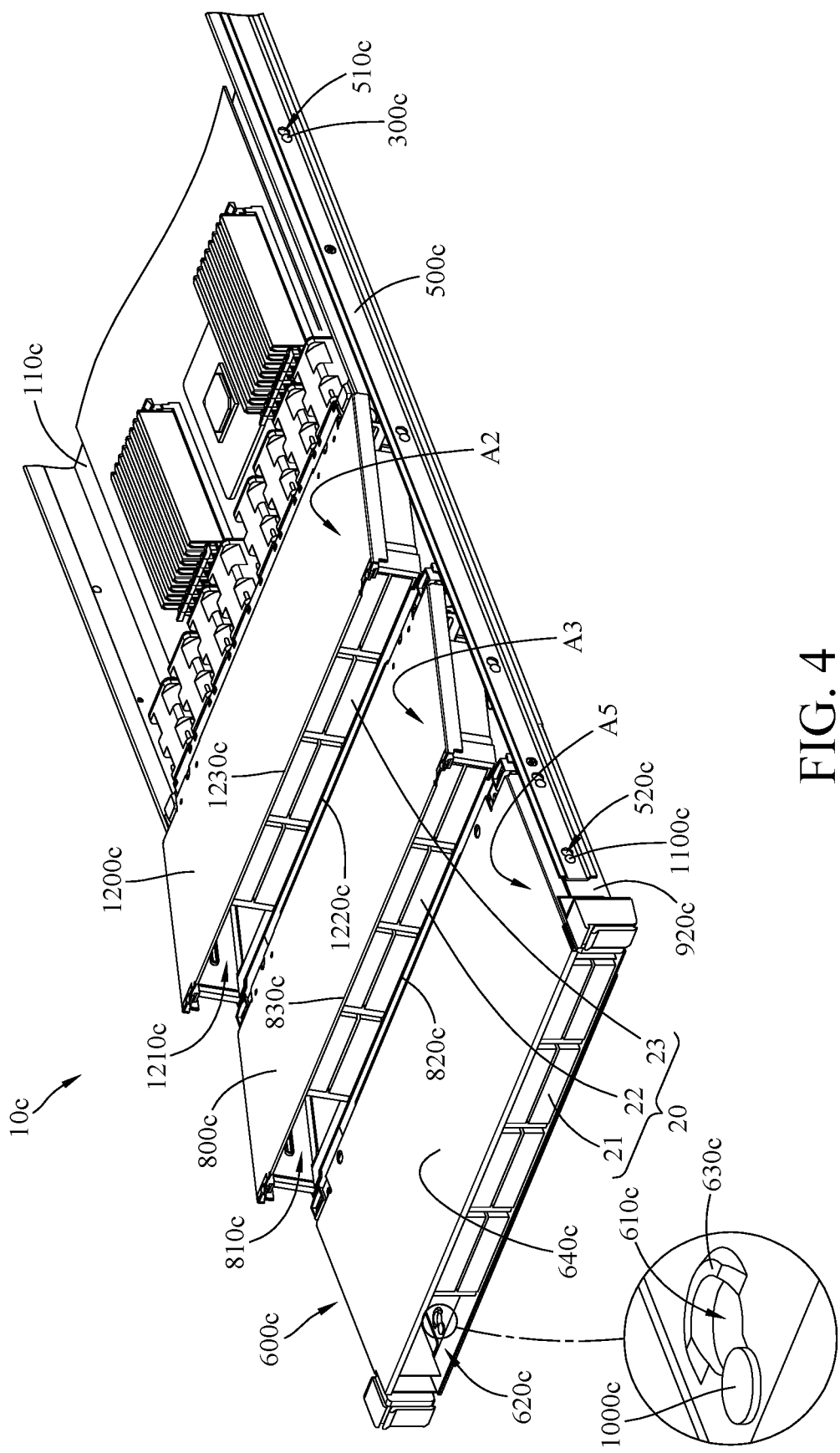
FIG. 4 is a perspective view of a server according to still another embodiment of the present disclosure.
Figure 5:
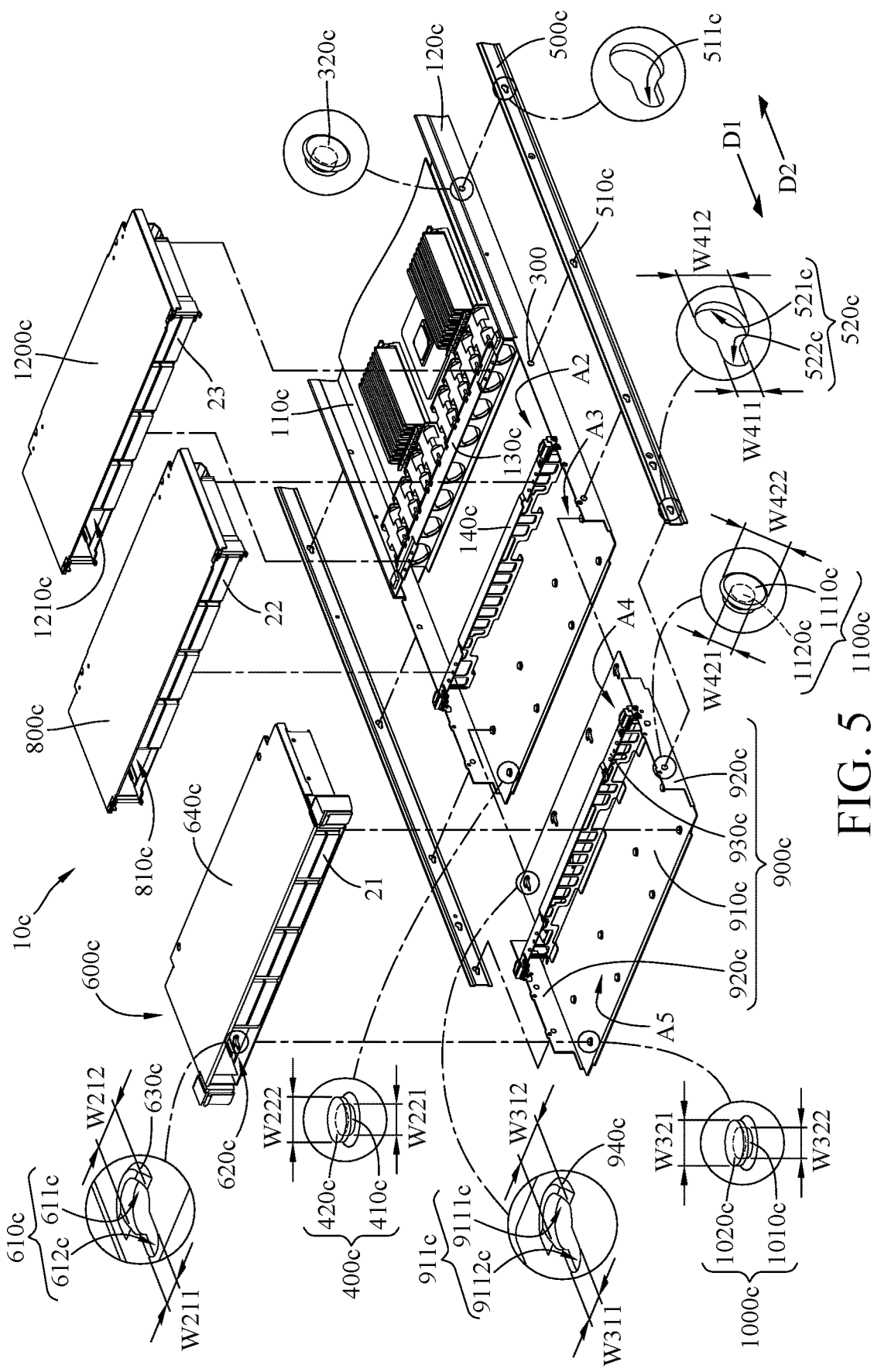
FIG. 5 to FIG. 7 are perspective views of the server in FIG. 4 while an expansion frame is being installed on a first bottom plate.
Figure 6:
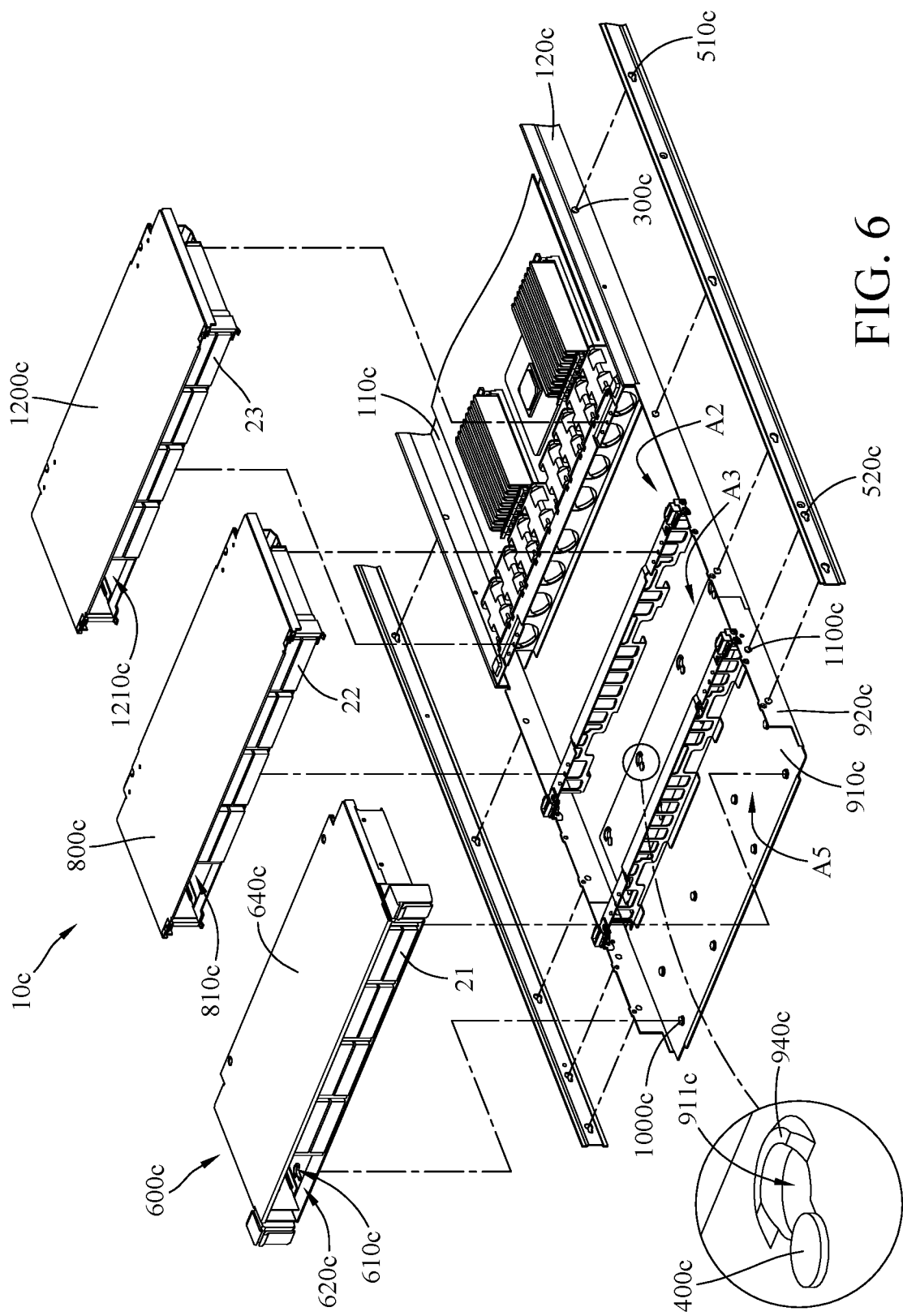
Figure 7:
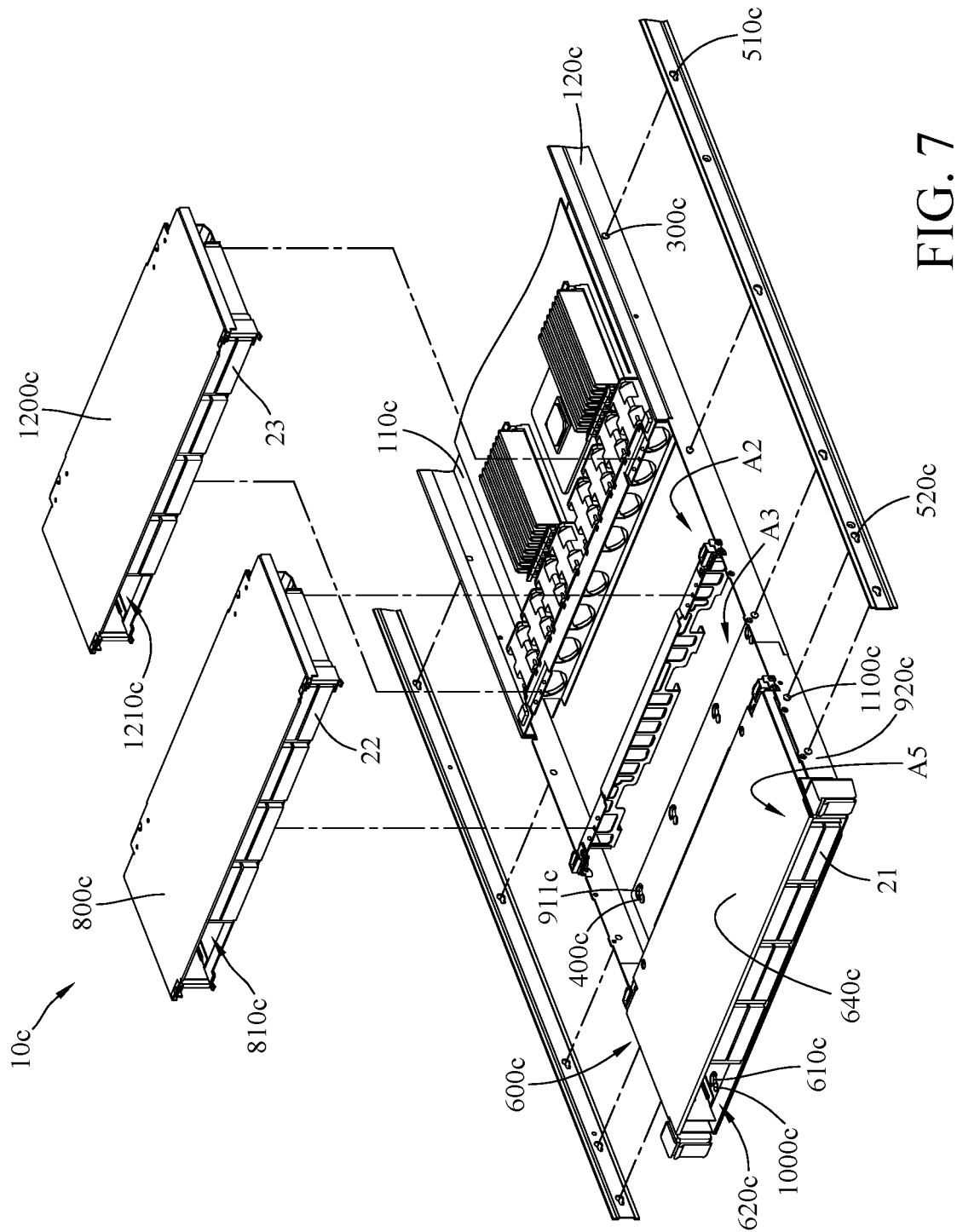

Hereinafter, taking the frame for instance, please refer to FIG. 4 to FIG. 7, where FIG. 4 is a perspective view of a server 10c according to still another embodiment of the present disclosure, and FIG. 5 to FIG. 7 are perspective views of the server 10c in FIG. 4 while an expansion frame 900c is being installed on the first bottom plate 110c. Only the differences between this and the previous embodiments are illustrated hereinafter. In this and some embodiments of the present disclosure, the quantity of the at least one storage device 20 is three or more. The storage devices 20 are divided into three groups: the first storage device group 21, the second storage device group 22, and a third storage device group 23. The server 10c may further include the expansion frame 900c. The expansion frame 900c includes a second bottom plate 910c, at least one second side wall 920c, and a third partition 930c. The quantity of the second side wall 920c is, for example, two. The second side walls 920c and the third partition 930c are disposed on the second bottom plate 910c. The third partition 930c is located at a side of one of the second side walls 920c. Specifically, the third partition 930c is located between the two second side walls 920c. The second bottom plate 910c and the second side walls 920c together form another accommodation space (not numbered) that is divided into a fourth area A4 and a fifth area A5 by the third partition 930c.

The second bottom plate 910c has at least one third positioning groove 911c in the fourth area A4. The quantity of the third positioning groove 911c is, for example, plural. The quantity of the third positioning grooves 911c may be equal to the quantity of the second positioning pins 400c. The longitudinal directions of the third positioning grooves 911c are in the same direction (e.g., the direction D1 shown in FIG. 5) where the first opening 620c faces. As shown in FIG. 5 and FIG. 6, the expansion frame 900c is detachably disposed on the second positioning pins 400c in the third area A3 via the third positioning grooves 911c. When the expansion frame 900c is installed on the first bottom plate 110c, the fourth area A4 is overlapped with the third area A3. The second area A2 is configured to accommodate the first storage device group 21, and the third area A3 and the fourth area A4 are configured to together accommodate the second storage device group 22. In addition, the expansion frame 900c provides additional accommodating space (e.g., the fifth area A5), the fifth area A5 can accommodate third storage device group 23.

In this and some embodiments of the present disclosure, since the third positioning grooves 911c have the same structure, thus only one third positioning groove 911c would be introduced hereinafter. The third positioning groove 911c has a wide portion 9111c and a narrow portion 9112c connected to each other. The narrow portion 9112c is located closer to the first opening 620c than the wide portion 9111c. A width W311 of the narrow portion 9112c is less than a width W312 of the wide portion 9111c. The width W221 of the head portion 420c of the second positioning pin 400c ranges between the width W312 of the wide portion 9111c and the width W311 of the narrow portion 9112c. The width W222 of the neck portion 410c of the second positioning pin 400c is less than the width W312 of the wide portion 9111c and the width W311 of the narrow portion 9112c. During the installation of the expansion frame 900c on the second positioning pins 400c, the wide portions 9111c of the third positioning grooves 911c are respectively aligned with the second positioning pins 400c, then the head portions 420c of the second positioning pins 400c respectively pass through the wide portions 9111c of the third positioning grooves 911c, and then the expansion frame 900c is moved along the direction D2, such that the expansion frame 900c is engaged with the second positioning pins 400c, thereby accomplishing the installation of the expansion frame 900c.

In this and some embodiments of the present disclosure, the server 10c may further include at least one third positioning pin 1000c. The quantity of the third positioning pin 1000c is, for example, plural. The quantity of the third positioning pins 1000c may be equal to the quantity of the quantity of the second positioning grooves 610c of the first carrier 600c. The third positioning pins 1000c are disposed in the fifth area A5 of the expansion frame 900c. The first carrier 600c is detachably disposed on the third positioning pins 1000c in the fifth area A5 via the second positioning grooves 610c. At this time, the top surface 640c of the first carrier 600c faces away from the second bottom plate 910c.

In this and some embodiments of the present disclosure, since the third positioning pins 1000c have the same structure, thus only one third positioning pin 1000c would be introduced hereinafter. The third positioning pin 1000c has a neck portion 1010c and a head portion 1020c. The head portion 1020c is connected to one end of the neck portion 1010c located away from the second bottom plate 910c. A width W321 of the head portion 1020c ranges between the width W212 of the wide portion 611c of the first carrier 600c and the width W211 of the narrow portion 612c. A width W322 of the neck portion 1010c is less than the width W212 of the wide portion 611c of the first carrier 600c and the width W211 of the narrow portion 612c. During the installation of the first carrier 600c on the third positioning pins 1000c, as shown in FIG. 6 to FIG. 7, the wide portions 611c of the second positioning grooves 610c are respectively aligned with the third positioning pins 1000c, then the head portions 1020c of the third positioning pins 1000c respectively pass through the wide portions 611c of the second positioning grooves 610c, and then the first carrier 600c is moved along the direction D2, such that the first carrier 600c is engaged with the third positioning pins 1000c, thereby accomplishing the installation of the first carrier 600c.

In this and some embodiments of the present disclosure, the server 10c may further include at least one fourth positioning pin 1100c. The quantity of the at least one fourth positioning pin 1100c is, for example, plural. The fourth positioning pins 1100c are disposed are disposed on sides of the second side walls 920c located away from the third partition 930c. Each of the slide rails 500c may further have at least one fourth positioning groove 520c. Specifically, the quantity of the at least one fourth positioning groove 520c is, for example, plural. The quantity of the fourth positioning grooves 520c may be equal to the quantity of the fourth positioning pins 1100c. The slide rails 500c are detachably disposed on the fourth positioning pins 1100c and the first positioning pins 300c via the fourth positioning grooves 520c and the first positioning grooves 510c, and thus the slide rails 500c are located at the sides of the second side walls 920c located away from the third partition 930c and the sides of the first side walls 120c located away from the first partition 130c and the second partition 140c.

Similarly, since the fourth positioning grooves 520c have the same structure, and the fourth positioning pins 1100c have the same structure, thus only one fourth positioning groove 520c and one fourth positioning pin 1100c would be introduced hereinafter. The fourth positioning groove 520c has a wide portion 521c and a narrow portion 522c connected to each other. The narrow portion 522c is located closer to the first opening 620c than the wide portion 521c. A width W411 of the narrow portion 522c is less than a width W412 of the wide portion 521c. The fourth positioning pins 1100c has a neck portion 1110c and a head portion 1120c. The head portion 1120c is connected to one end of the neck portion 1110c located away from the second side wall 920c. A width W421 of the head portion 1120c ranges between the width W412 of the wide portion 521c and the width W411 of the narrow portion 522c. A width W422 of the neck portion 1110c is less than the width W412 of the wide portion 521c and the width W411 of the narrow portion 522c. During the installation of the slide rails 500c on the first positioning pins 300c and the fourth positioning pins 1100c, the wide portions 521c of the fourth positioning grooves 520c are respectively aligned with the fourth positioning pins 1100c, the wide portions 511c of the first positioning grooves 510c are respectively aligned with the first positioning pins 300c, then the head portions 1120c of the fourth positioning pins 1100c respectively pass through the wide portions 521c of the fourth positioning grooves 520c, the head portions 320c of the first positioning pins 300c respectively pass through the wide portions 511c of the first positioning grooves 510c, and then the slide rails 500c is moved along the direction D2, such that the slide rails 500c is engaged with the first positioning pins 300c and the fourth positioning pins 1100c, thereby accomplishing the installation of the slide rails 500c.

After installing the expansion frame 900c, the first carrier 600c, and the slide rails 500c, the second side walls 920c can be fixed to the first carrier 600c by screwing, and the slide rails 500c can be fixed to the second side walls 920c and the first side walls 120c by screwing so as to secure the entire structure of the server 10c. To remove the expansion frame 900c, the first carrier 600c, and the slide rails 500c, the aforementioned steps of the installation of the expansion frame 900c, the first carrier 600c, and the slide rails 500c can be reversely performed.

In this and some embodiments of the present disclosure, the expansion frame 900c may further include at least one second protrusion portion 940c. The quantity of the at least one second protrusion 940c may be equal to the quantity of the third positioning grooves 911c. The second protrusion portions 940c are disposed on the second bottom plate 910c and are respectively located adjacent to the wide portions 9111c of the third positioning grooves 911c. The second protrusion portions 940c can enhance the structural strength of the expansion frame 900c so as to prevent structural damage near the wide portions 9111c due to an unexpected impact during the installation of the expansion frame 900c. Similarly, the first protrusion portions 630c can enhance the structural strength of the first carriers 600c so as to prevent structural damage near the wide portions 611c due to an unexpected impact during the installation of the first carrier 600c.

After the expansion frame 900c and the first carrier 600c are respectively installed on the second positioning pins 400c and the third positioning pins 1000c, the second carrier 800c is pivotably disposed on the first bottom plate 110c and is located in the third area A3 and the fourth area A4 instead of the second area A2, which is different from the previous embodiment. The second opening 810c of the second carrier 800c is located adjacent to the first carrier 600c. The first edge 820c is located between the first bottom plate 110c and the second edge 830c. The first edge 820c is located at a side of the top surface 640c of the first carrier 600c located away from the second bottom plate 910c or is located between the top surface 640c and the second bottom plate 910c based on a pivoting position of the second carrier 800c with respect to the first bottom plate 110c.

In this and some embodiments of the present disclosure, the server 10c may further include a third carrier 1200c. The third carrier 1200c is pivotably disposed on the first bottom plate 110c and is located in the second area A2. The third carrier 1200c has a third opening 1210c located adjacent to the second carrier 800c. The third carrier 1200c has a third edge 1220c and a fourth edge 1230c that are opposite to each other at the third opening 1210c. The third edge 1220c is located between the first bottom plate 110c and the fourth edge 1230c. The third edge 1220c is located at a side of an extension plane (not shown) of the top surface 640c of the first carrier 600c located away from the second bottom plate 910c or is located between the extension plane of the top surface 640c and the second bottom plate 910c based on a pivoting position of the third carrier 1200c with respect to the first bottom plate 110c. In other words, the third opening 1210c is selectively exposed outside based on the pivoting of the third carrier 1200c with respect to the first bottom plate 110c.

When the third opening 1210c is exposed outside, the third opening 1210c of the third carrier 1200c allows the third storage device group 23 to be accommodated in or removed from the third carrier 1200c. In addition, the first storage device group 21 and the second storage device group 22 are respectively accommodated in or removed from the first carrier 600c and the second carrier 800c in manners abovementioned. In detail, in the case of the storage devices 20 including 2.5-inch hard disk drives, each of the first carrier 600c, the second carrier 800c, and the third carrier 1200c can accommodate at most eight storage devices 20; in the case of the storage devices 20 including 3.5-inch hard disk drives, each of the first carrier 600c, the second carrier 800c, and the third carrier 1200c can accommodate at most four storage devices 20. In addition, the storage devices 20 may further include an optical disk drive based on the actual requirement. There is still space in the first carrier 600c, the second carrier 800c, or the third carrier 1200c to accommodate the optical disk drive after the eight 2.5-inch hard disk drives or four 3.5-inch hard disk drives are accommodated therein. Since the storage devices 20 are accommodated in the first carrier 600c, the second carrier 800c, and the third carrier 1200c, it is easy to arrange or move the storage devices 20.

According to the server discussed above, the second positioning pins are configured for different components to be disposed thereon based on the actual requirement. The second positioning pins allows different components that can accommodate or support the at least one storage device, thus the arrangement of the server can be flexibly changed according to the actual requirement. And, in this way, the arrangements of the server in the first area and the second area will not be affected by the arrangement of the server in the third area, thus components in the first area and the second area can be still utilized as the arrangement of the server in the third area is changed.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A server, configured to accommodate at least one storage device, the server comprising:
   a chassis, comprising a first bottom plate, at least one first side wall, a first partition and a second partition, wherein the at least one first side wall, the first partition, and the second partition are disposed on the first bottom plate, the first partition and the second partition are located at a same side of the at least one first side wall, the first bottom plate is divided into a first area, a second area, and a third area by the first partition and the second partition, the second area is located between the first area and the third area, and the third area is configured for the at least one storage device to be placed therein;
   an electronic component, disposed in the first area of the first bottom plate, wherein the electronic component is configured to be electrically connected to the at least one storage device, and the first partition is located closer to the electronic component than the second partition;
   at least one first positioning pin, disposed at a side of the at least one first side wall located away from the first partition and the second partition;
   at least one second positioning pin, disposed in the third area of the first bottom plate; and
   at least one slide rail, having at least one first positioning groove, wherein the at least one slide rail is detachably disposed on the at least one first positioning pin via the at least one first positioning groove.

2. The server according to claim 1, further comprising a first carrier, wherein the first carrier has at least one second positioning groove and a first opening, a longitudinal direction of the at least one second positioning groove is in a same direction as a facing direction of the first opening, the first carrier is detachably disposed on the at least one second positioning pin in the third area via the at least one second positioning groove, and the first carrier is configured to accommodate the at least one storage device via the first opening.

3. The server according to claim 2, wherein each of the at least one first positioning groove and the at least one second positioning groove has a wide portion and a narrow portion connected to each other, the narrow portion is located closer to the first opening than the wide portion, a width of the narrow portion is less than a width of the wide portion, each of the at least one first positioning pin and the at least one second positioning pin has a neck portion and a head portion, the head portion is disposed at one end of the neck portion, a width of the head portion ranges between the width of the wide portion and the width of the narrow portion, and a width of the neck portion is less than the width of the wide portion and the width of the narrow portion.

4. The server according to claim 2, further comprising a second carrier, wherein a quantity of the at least one storage device is plural, the second carrier is pivotably disposed on the first bottom plate and is located in the second area, the second carrier has a second opening located adjacent to the first carrier, the second carrier has a first edge and a second edge that are opposite to each other at the second opening, the first edge is located between the first bottom plate and the second edge, the first carrier has a top surface facing away from the first bottom plate, the first edge is located at a side of the top surface located away from the first bottom plate or is located between the top surface and the first bottom plate based on a pivoting position of the second carrier with respect to the first bottom plate, and the second carrier is configured to accommodate at least one of the storage devices via the second opening.

5. The server according to claim 2, further comprising a cover plate disposed on the first partition or the second partition, wherein the cover plate is opposite to and spaced apart from the first bottom plate, and the cover plate is located in the second area.

6. The server according to claim 1, further comprising an expansion frame, wherein a quantity of the at least one storage device is at least three, the expansion frame comprises a second bottom plate, at least one second side wall, and a third partition, the at least one second side wall and the third partition are disposed on the second bottom plate, the third partition is located at a side of the at least one second side wall, the second bottom plate is divided into a fourth area and a fifth area by the third partition, the second bottom plate has at least one second positioning groove in the fourth area, the expansion frame is detachably disposed on the at least one second positioning pin in the third area via the at least one second positioning groove, the fourth area is overlapped with the third area, and the second area, the third area, and the fifth area are respectively configured for the at least three storage devices to be placed therein.

7. The server according to claim 6, further comprising at least one third positioning pin, a first carrier, a second carrier, and a third carrier, wherein the at least one third positioning pin is disposed in the fifth area of the second bottom plate, the first carrier has at least one third positioning groove, a first opening, and a top surface, a longitudinal direction of the at least one second positioning groove and a longitudinal direction of the at least one third positioning groove are in a same direction as a facing direction of the first opening, the top surface faces away from the second bottom plate, the first carrier is detachably disposed on the at least one third positioning pin in the fifth area via the at least one third positioning groove, the second carrier and the third carrier are pivotably disposed on the first bottom plate and are respectively located in the third area and the second area, the second carrier has a second opening located adjacent to the first carrier, the second carrier has a first edge and a second edge that are opposite to each other at the second opening, the first edge is located between the first bottom plate and the second edge, the first edge is located at a side of the top surface located away from the second bottom plate or is located between the top surface and the second bottom plate based on a pivoting position of the second carrier with respect to the first bottom plate, the third carrier has a third opening located adjacent to the second carrier, the third carrier has a third edge and a fourth edge that are opposite to each other at the third opening, the third edge is located between the first bottom plate and the fourth edge, the third edge is located at a side of an extension plane of the top surface located away from the second bottom plate or is located between the extension plane of the top surface and the second bottom plate based on a pivoting position of the third carrier with respect to the first bottom plate, and the first carrier, the second carrier, and the third carrier are respectively configured to accommodate the at least three storage devices via the first opening, the second opening, and the third opening.

8. The server according to claim 7, further comprising at least one fourth positioning pin disposed at a side of the at least one second side wall located away from the third partition, wherein the at least one slide rail further has at least one fourth positioning groove, and the at least one slide rail is detachably disposed on the at least one fourth positioning pin via the at least one fourth positioning groove.

9. The server according to claim 8, wherein each of the at least one first positioning groove, the at least one second positioning groove, the at least one third positioning groove, and the at least one fourth positioning groove has a wide portion and a narrow portion connected to each other, the narrow portion is located closer to the first opening than the wide portion, a width of the narrow portion is less than a width of the wide portion, each of the at least one first positioning pin, the at least one second positioning pin, the at least one third positioning pin, and the at least one fourth positioning pin has a neck portion and a head portion, the head portion is disposed at one end of the neck portion, a width of the head portion ranges between the width of the wide portion and the width of the narrow portion, and a width of the neck portion is less than the width of the wide portion and the width of the narrow portion.

10. The server according to claim 9, wherein the first carrier comprises at least one first protrusion portion located adjacent to the wide portion of the at least one third positioning groove, and the expansion frame further comprises at least one second protrusion portion disposed on the second bottom plate and located adjacent to the wide portion of the second positioning groove.

* * * * *